US012750063B2

(12) United States Patent
Lee

(10) Patent No.: US 12,750,063 B2
(45) Date of Patent: Sep. 29, 2026

(54) TRANSITION SMOOTHING APPARATUS FOR REDUCING SPURIOUS INPUT TO A SYSTEM UNDER FEEDBACK CONTROL

(71) Applicant: SKYWORKS SOLUTIONS, INC., Irvine, CA (US)

(72) Inventor: Wai Laing Lee, Portland, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 230 days.

(21) Appl. No.: 18/785,828

(22) Filed: Jul. 26, 2024

(65) Prior Publication Data

US 2024/0388304 A1 Nov. 21, 2024

Related U.S. Application Data

(63) Continuation of application No. 17/934,601, filed on Sep. 23, 2022, now Pat. No. 12,081,228.

(Continued)

(51) Int. Cl.
*H03M 1/00* (2006.01)
*H03F 3/217* (2006.01)

(Continued)

(52) U.S. Cl.
CPC ........ *H03M 1/0631* (2013.01); *H03F 3/2173* (2013.01); *H03M 1/181* (2013.01)

(58) Field of Classification Search
CPC ............... H03F 2200/03; H03F 3/2173; H03F 2200/351; H03F 3/217; H03F 3/187; H03F 3/2175; H03F 2200/331; H03F 3/2171; H03F 3/45475; H03F 3/185; H03F 1/3264; H03F 1/523; H03F 2203/45512; H03F 3/183; H03F 3/2178; H03F 3/68; H03F 1/0211; H03F 1/0255; H03F 1/26; H03F 2200/171; H03F 2200/345; H03F 2200/462; H03F 2200/78; H03F 3/45928; H03F 1/02; H03F 1/0227; H03F 1/0233;

(Continued)

(56) References Cited

U.S. PATENT DOCUMENTS 5,777,512 A 7/1998 Tripathi et al.
6,373,334 B1 * 4/2002 Melanson ............ H03M 3/388 330/10

(Continued)

*Primary Examiner* — Linh V Nguyen

(74) *Attorney, Agent, or Firm* — Lando & Anastasi, LLP

(57) ABSTRACT

Transition smoothing apparatus for reducing spurious input to a system under feedback control connected to a control loop. The apparatus includes a loop filter to integrate an error between an input signal applied to the loop filter and an output signal of the system under feedback control, an analog-to-digital converter to provide digitized integrated error values, a controller to generate output values supplied to the system under feedback control in response to the digitized integrated error values and in a start-up sequence to control a feedback digital-to-analog converter according to the digitized integrated error values to supply a first control signal to the loop filter and control the system under feedback control to generate a second control signal, and an alignment detector to detect phase alignment between the first control signal and the second control signal to control a smooth transition into closed loop operation of the control loop.

20 Claims, 8 Drawing Sheets

Related U.S. Application Data

(60) Provisional application No. 63/391,011, filed on Jul. 21, 2022, provisional application No. 63/249,725, filed on Sep. 29, 2021.

(51) Int. Cl.
*H03M 1/06* (2006.01)
*H03M 1/18* (2006.01)

(58) Field of Classification Search
CPC .......... H03F 1/0261; H03F 1/305; H03F 1/32; H03F 1/3205; H03F 1/3247; H03F 1/34; H03F 1/342; H03F 1/56; H03F 2200/129; H03F 2200/18; H03F 2200/267; H03F 2200/333; H03F 2200/342; H03F 2200/426; H03F 2200/432; H03F 2200/453; H03F 2200/481; H03F 2200/511; H03F 2200/66; H03F 2203/45048; H03F 2203/45074; H03F 2203/45526; H03F 2203/45528; H03F 2203/45534; H03F 2203/45536; H03F 2203/45594; H03F 2203/45631; H03F 2203/45634; H03F 2203/45702; H03F 3/16; H03F 3/181; H03F 3/1855; H03F 3/211; H03F 3/213; H03F 3/38; H03F 3/387; H03F 3/45479; H03F 3/45991; H03M 3/506; H03M 3/43; H03M 3/432; H03M 3/358; H03M 3/50; H03M 1/46; H03M 1/60; H03M 3/344; H03M 3/424; H03M 3/436; H03M 3/452; H03M 3/456; H03M 3/458; H03M 3/496; H03M 1/0626; H03M 1/0631; H03M 1/066; H03M 1/0665; H03M 1/1235; H03M 1/181; H03M 1/361; H03M 1/368; H03M 1/462; H03M 1/504; H03M 1/56; H03M 1/64; H03M 1/66; H03M 1/747; H03M 1/822; H03M 3/042; H03M 3/32; H03M 3/3283; H03M 3/346; H03M 3/348; H03M 3/366; H03M 3/37; H03M 3/388; H03M 3/422; H03M 3/426; H03M 3/438; H03M 3/448; H03M 3/45; H03M 3/454; H03M 3/464; H03M 3/488; H03M 3/494; H03M 7/165; H03M 7/3006; H03M 7/3028; H03M 7/3031; H04R 3/00; H04R 2430/01; H04R 2499/13; H04R 3/04; H04R 1/06; H04R 3/02; H03K 7/08; H03K 4/066; H03K 17/082; H03K 17/162; H03K 17/687; H03K 19/017509; H03K 19/21; H03K 2005/00078; H03K 2005/00286; H03K 2217/0063; H03K 2217/0072; H03K 3/017; H03K 3/0315; H03K 4/06; H03K 5/01; H03K 5/26
USPC ......................... 341/118–120, 126, 143, 155
See application file for complete search history.

(56) References Cited

U.S. PATENT DOCUMENTS

| | | | | |
|---|---|---|---|---|
| 6,414,614 | B1 * | 7/2002 | Melanson | H03F 3/217 330/10 |
| 6,646,502 | B1 * | 11/2003 | Kruiskamp | H03F 3/2173 330/10 |
| 6,765,436 | B1 * | 7/2004 | Melanson | H03F 3/217 330/132 |
| 6,998,910 | B2 | 2/2006 | Hezar et al. | |
| 7,058,464 | B2 * | 6/2006 | Mallinson | H03F 3/2175 330/10 |
| 7,084,799 | B1 * | 8/2006 | Butler | H03M 3/3283 341/143 |
| 7,200,187 | B2 | 4/2007 | O'Brien | |
| 7,394,209 | B2 * | 7/2008 | Lin | H05B 41/2828 315/307 |
| 7,538,607 | B2 * | 5/2009 | Morishima | H03F 3/217 330/10 |
| 7,649,958 | B2 | 1/2010 | Macphail et al. | |
| 9,019,008 | B2 * | 4/2015 | Van Holland | H03F 3/2178 330/10 |
| 9,768,799 | B1 | 9/2017 | Yoo et al. | |
| 11,250,830 | B2 | 2/2022 | Wurtz | |
| 2015/0155836 | A1 | 6/2015 | Midya et al. | |
| 2016/0308577 | A1 | 10/2016 | Molina et al. | |
| 2017/0294888 | A1 | 10/2017 | Berkhout et al. | |
| 2019/0007010 | A1 | 1/2019 | Høyerby | |
| 2020/0228076 | A1 | 7/2020 | Lee | |
| 2021/0203287 | A1 * | 7/2021 | Kinyua | H03F 3/2173 |
| 2022/0308613 | A1 | 9/2022 | Zanbaghi et al. | |
| 2022/0345149 | A1 | 10/2022 | Bal et al. | |
| 2023/0058434 | A1 | 2/2023 | Yang et al. | |
| 2023/0097106 | A1 | 3/2023 | Peting et al. | |
| 2023/0101927 | A1 | 3/2023 | Peting | |
| 2023/0238926 | A1 * | 7/2023 | Sakai | H03F 3/217 381/86 |
| 2023/0247354 | A1 * | 8/2023 | Sakai | H03F 3/2173 381/86 |
| 2024/0030930 | A1 | 1/2024 | Lee | |

* cited by examiner

TRANSITION SMOOTHING APPARATUS FOR REDUCING SPURIOUS INPUT TO A SYSTEM UNDER FEEDBACK CONTROL

CROSS-REFERENCE TO RELATED APPLICATIONS

This application claims the benefit under 35 U.S.C. § 120 as a continuation of U.S. patent application Ser. No. 17/934,601, titled "TRANSITION SMOOTHING APPARATUS FOR REDUCING SPURIOUS INPUT TO A SYSTEM UNDER FEEDBACK CONTROL" filed Sep. 23, 2022, which is incorporated by reference herein in its entirety for all purposes. U.S. patent application Ser. No. 17/934,601 claims priority under 35 U.S.C. § 119 (e) to U.S. Provisional Patent Application Ser. No. 63/391,011, titled "TRANSITION SMOOTHING APPARATUS FOR REDUCING SPURIOUS INPUT TO A SYSTEM UNDER FEEDBACK CONTROL" filed Jul. 21, 2022, and to U.S. Provisional Patent Application Ser. No. 63/249,725, titled "NOISE REDUCTION APPARATUS FOR REDUCING AN ACOUSTIC STARTUP NOISE OF A CLASS D-AMPLIFIER," filed Sep. 29, 2021, the entire contents of which are incorporated herein by reference for all purposes.

BACKGROUND

Field

Embodiments of the present disclosure relate to electronic systems and in particular to a transition smoothing apparatus such as a noise reduction apparatus adapted to reduce an acoustic startup noise of a class D-amplifier.

Description of the Related Technology

Class D-amplifiers are widely used in acoustic systems. Class D-amplifiers provide a high power efficiency when compared to other audio amplifier classes such as class A, B, and AB audio amplifiers. Transistors of a class D-amplifier are used as switches to steer electrical current through a connected load resulting in a minimal power loss.

In an electronic device, an integrated system or electronic circuit under feedback control may undergo a transition from one operation state to another operation state. For example, when the electronic circuit under feedback control is starting up from a non-active mode to a steady-state mode of operation. This transition can cause spurious input to the respective system under feedback control.

SUMMARY

In accordance with one aspect of the present disclosure, a transition smoothing apparatus for reducing spurious input to a system under feedback control connected to a control loop of the transition smoothing apparatus is provided. The transition smoothing apparatus comprises a loop filter to integrate an error between an input signal applied to the loop filter and an output signal of the system under feedback control, an analog-to-digital converter to digitize the integrated error every loop cycle of the control loop to provide a digitized integrated error value, a controller, and an alignment detector. The controller is configured to generate in a normal operation mode output values supplied to the system under feedback control in response to the digitized integrated error values and is adapted in a start-up sequence to control a feedback digital-to-analog converter of the control loop according to the digitized integrated error values to supply a first control signal to the loop filter of the control loop and to control the system under feedback control to generate an independent second control signal. The alignment detector is configured to detect a phase alignment between the first control signal provided by the feedback digital-to-analog converter of the control loop and the second control signal provided by the system under feedback control to control a smooth transition into a closed loop operation of the control loop in the normal operation mode during the start-up sequence with reduced spurious input to the system under feedback control.

In one example, the alignment detector is integrated in the controller of the control loop of the transition smoothing apparatus. In another example, the loop filter comprises an analog low pass filter. In a further example, the analog-to-digital converter of the control loop is adapted to supply the digitized integrated error value every sample period to a digital input of the controller of the control loop. In one example, the digitized integrated error value supplied by the analog-to-digital converter to the digital input of the controller comprises an ADC code with an offset binary format. In yet another example, the controller includes a supply voltage monitoring and prediction circuit adapted to maintain a target voltage. In a still further example, the controller includes a common mode control circuit adapted to maintain a set-point common mode voltage.

According to another example, the system under feedback control is an H-bridge driver of a class D-amplifier including a positive H-bridge driver circuit having a positive output terminal and a negative H-bridge circuit having a negative output terminal. In one example, a loudspeaker is connected to the positive output terminal and to the negative output terminal of the H-bridge driver of the class D-amplifier. In another example, the controller is adapted to supply a first gray coded output value to the positive H-bridge driver circuit of the H-bridge driver and a second gray coded output value to the negative H-bridge driver circuit of the H-bridge driver of said class D-amplifier.

According to another example, the system under feedback control comprises a Phase Locked Loop, PLL, circuit.

According to yet another example, the analog-to-digital converter comprises a SAR analog-to-digital converter.

According to one example, a control block of the transition smoothing apparatus is adapted to generate at least one start-up control signal applied to the controller to initiate during the start-up sequence a transition from an idle operation mode to the normal operation mode.

According to another example, the alignment detector is adapted to detect a phase alignment between a second fixed pattern control signal provided by the system under feedback control during the start-up sequence and the first control signal provided by the feedback digital-to-analog converter during the start-up sequence used to control during the start-up sequence a smooth transition from an idle operation mode to the normal operation mode with a reduced spurious input to the system under feedback control.

According to a further example, a control block of the transition smoothing apparatus is adapted to generate a shutdown control signal applied to the controller to initiate in a shutdown sequence a transition from the normal operation mode to an idle operation mode.

In another example, the controller is adapted to generate in the normal operation mode in response to the digitized integrated error values gray-coded output values supplied to the system under feedback control.

In a further example, the control loop of the transition smoothing apparatus comprises a PWM control loop including the loop filter, the analog-to-digital converter, the controller and the feedback digital-to-analog converter.

In another example, the transition smoothing apparatus comprises a noise reduction apparatus adapted to reduce acoustic start-up noise forming spurious input to the system under feedback control.

According to another aspect of the present disclosure, an alignment detector is provided. The alignment detector is adapted to detect a phase alignment between a first control signal provided by a feedback digital-to-analog converter of a control loop and a second control signal provided by a system under feedback control to control a smooth transition into a closed loop operation of the control loop in a normal operation mode during a start-up sequence with reduced spurious input to the system under feedback control.

According to one example, the system under feedback control comprises an H-bridge driver of a class D-amplifier including a positive H-bridge driver circuit having a positive output terminal and a negative H-bridge circuit having a negative output terminal. In accordance with this example, a loudspeaker is connected to the positive output terminal and to the negative output terminal of the H-bridge driver of the class D-amplifier.

In another example, the system under feedback control comprises a Phase Locked Loop, PLL, circuit.

According to another aspect of the present disclosure, a class D-amplifier including a transition smoothing apparatus having a system under feedback control connected to a control loop is provided. The transition smoothing apparatus includes a loop filter to integrate an error between an input signal applied to the loop filter and an output signal of the system under feedback control, an analog-to-digital converter adapted to digitize the integrated error every loop cycle of the control loop to provide a digitized integrated error value, a controller, and an alignment detector. The controller is configured to generate in a normal operation mode in response to the digitized integrated error values supplied to the system under feedback control and in a start-up sequence to control a feedback digital-to-analog converter of the control loop according to the digitized integrated error values to supply a first control signal to the loop filter of the control loop and to control the system under feedback control to generate an independent second control signal. The alignment detector is configured to detect a phase alignment between the first control signal provided by the feedback digital-to-analog converter of the control loop and the second control signal provided by the system under feedback control and to control a smooth transition into a closed loop operation of the control loop in the normal operation mode during the start-up sequence with reduced spurious input to the system under feedback control.

According to another aspect of the present disclosure, an audio device is provided. The audio device comprises a class D-amplifier having a PWM control loop, a H-bridge driver, a loudspeaker connected to the H-bridge driver, and a noise reduction apparatus. The noise reduction apparatus includes a loop filter to integrate an error between an input voltage which corresponds to an input audio signal and a voltage across a loudspeaker connected to a H-bridge driver of the class D-amplifier, an analog-to-digital converter to digitize the integrated error every loop cycle of the PWM control loop to provide a digitized integrated error value, a PWM controller and an alignment detector. The PWM controller is configured to generate in a normal operation mode in response to the digitized integrated error values output values supplied to the H-bridge driver of the class D-amplifier and in a start-up sequence to control a feedback digital-to-analog converter of the PWM control loop according to the digitized integrated error values to supply PWM pulses of a first control signal to the loop filter of the PWM control loop and to control the H-bridge driver of the class D-amplifier to generate a fixed PWM pulse pattern as a second independent control signal. The alignment detector is configured to detect a phase alignment between the PWM pulses of the first control signal provided by the feedback digital-to-analog converter of the PWM control loop and the fixed PWM pulse pattern of the second control signal provided by the H-bridge driver and to control a transition into a closed loop operation of the PWM control loop in the normal operation mode during the start-up sequence with reduced acoustic start-up noise.

According to a further aspect of the present disclosure, a method for reducing spurious input to a system under feedback control connected to a control loop is provided. The method comprises integrating, by a loop filter of the control loop, an error between an input signal applied to the loop filter and an output signal of the system under feedback control, digitizing, by an analog-to-digital converter of the control loop, the integrated error every loop cycle of the control loop to provide a digitized integrated error value, generating, by a controller of the control loop, in a normal operation mode in response to the digitized integrated error values output values supplied to the system under feedback control, the controller controlling in a start-up sequence a feedback digital-to-analog converter of the control loop according to the digitized integrated error values to supply a first control signal to the loop filter of the control loop and controlling the system under feedback control to generate an independent second control signal, and detecting, by an alignment detector a phase alignment between the first control signal provided by the feedback digital-to-analog converter of the control loop and the second control signal provided by the system under feedback control to control a smooth transition into a closed loop operation of the control loop in the normal operation mode during the start-up sequence with reduced spurious input to the system under feedback control.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1A:
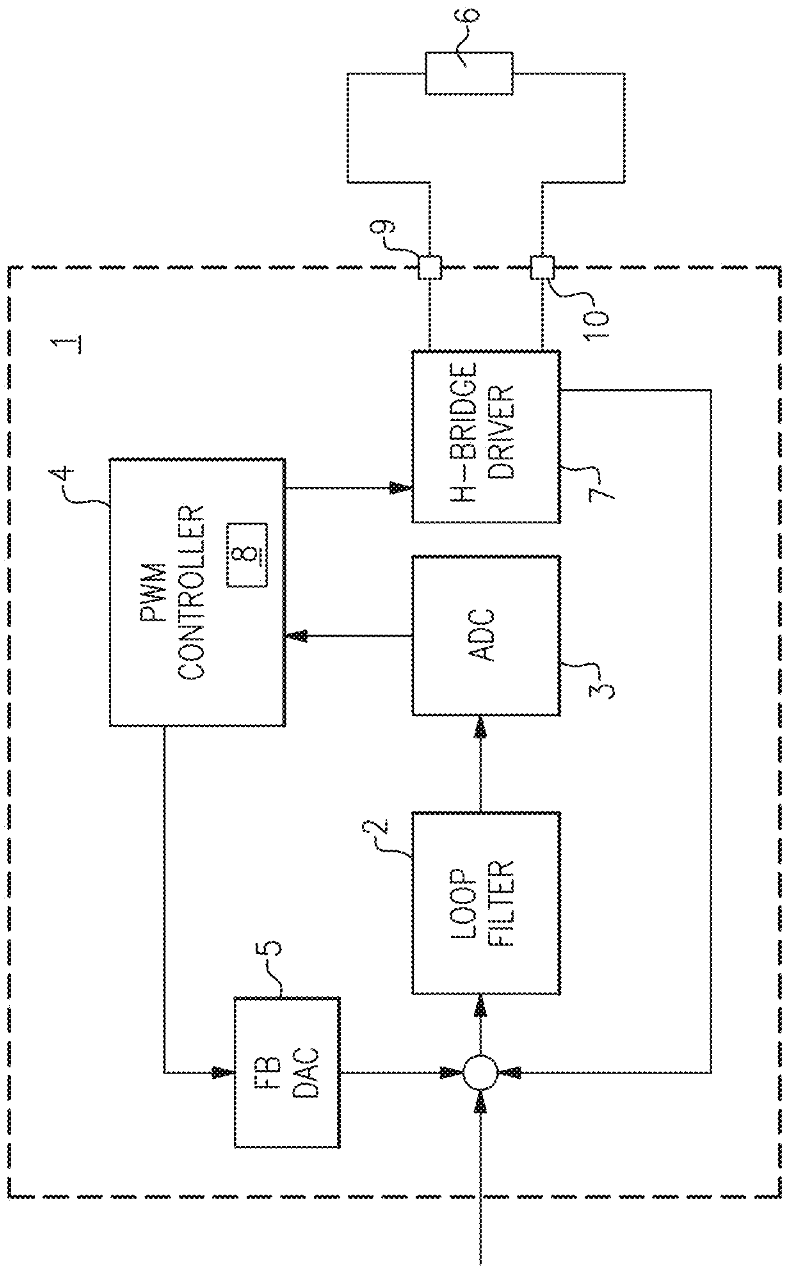
FIGS. 1A and 1B are schematic block diagrams illustrating embodiments of a transition smoothing apparatus.

The following detailed description of certain embodiments presents various descriptions of specific embodiments. However, the innovations described herein can be embodied in a multiple of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or in a subset of the elements illustrated in a drawing. Further, some embodiments can incorporate any suitable combination of features from two or more drawings.

Aspects of the present disclosure provide, according to a first aspect, a transition smoothing apparatus 1 for reducing spurious input to a system under feedback control 7 connected to a control loop. The control loop can, in a possible embodiment, comprise a loop filter such as the loop filter 2 shown in FIG. 1A adapted to integrate an error between an input signal applied to the loop filter and an output signal of the system under feedback control 7 such as an H-Bridge driver illustrated in the block diagram of FIG. 1A. An analog-to-digital converter 3 of the control loop is adapted to digitize the integrated error every loop cycle of the control loop to provide a digitized integrated error value. A controller of the control loop, such as the controller 4 illustrated in FIG. 1A, is adapted to generate, in a normal operation mode, output values supplied to the system under feedback control 7 in response to the digitized integrated error values and is adapted in a start-up sequence to control a feedback digital-to-analog converter 5 of the control loop according to the digitized integrated error values to supply a first control signal to the loop filter 2 of the control loop and to control the system under feedback control 7 to generate an independent second control signal. An alignment detector 8 of the transition smoothing apparatus 1 is adapted to detect a phase alignment between the first control signal provided by the feedback digital-to-analog converter 5 of the control loop and the second control signal provided by the system under feedback control 7 to control a smooth transition into a closed loop operation of the control loop in the normal operation mode during the start-up sequence with reduced spurious input to the system under feedback control 7.

The system under feedback control 7 can be an H-bridge driver circuit as illustrated in FIG. 1A but also another kind of circuit under feedback control such as a phase locked loop circuit.

FIG. 1A shows a schematic block diagram of an embodiment of a transition smoothing apparatus 1. In the illustrated embodiment the transition smoothing apparatus 1 is a noise reduction apparatus 1 adapted to reduce an acoustic startup noise of a class D-amplifier. The start-up noise is coming out of a loudspeaker 6 connected to the H-bridge driver circuit 7 of a class D-amplifier as illustrated in the block diagram of FIG. 1A. The class D-amplifier includes a PWM control loop as illustrated in the block diagram of FIG. 1A.

The PWM control loop comprises a loop filter 2, an analog-to-digital converter (ADC) 3, a PWM controller 4 and a feedback (FB) digital-to-analog converter (DAC) 5.

Figure 2:
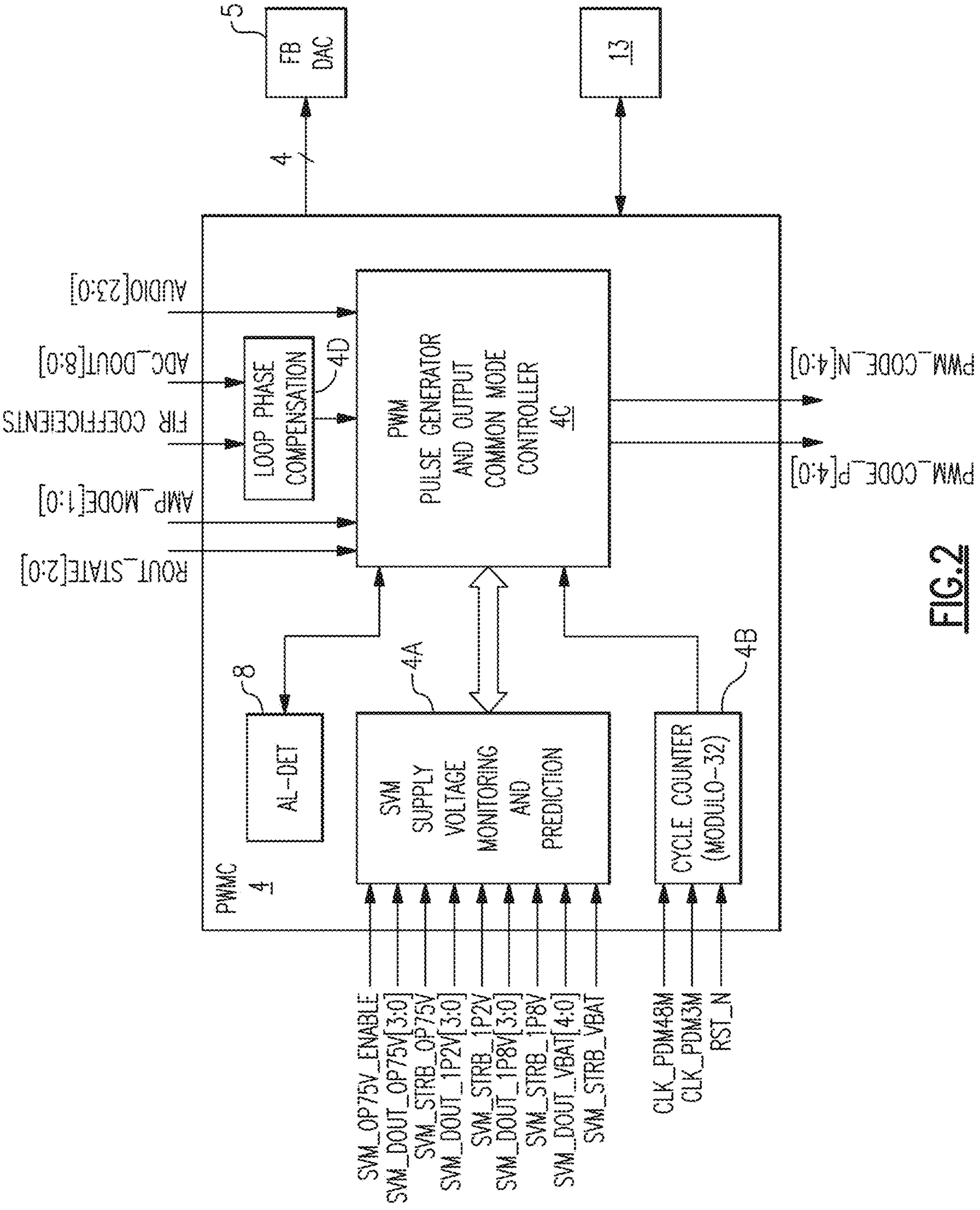
FIG. 2 is a functional block diagram of a PWM controller within a transition smoothing apparatus.

The loop filter 2 of the PWM control loop is adapted to integrate an error between an input voltage which corresponds to an input audio signal and a voltage across a loudspeaker 6 connected to an H-bridge driver 7 of the class D-amplifier. The loop filter 2 of the PWM control loop can comprise in a possible embodiment an analog low-pass filter. The output of the loop filter 2 is connected to the input of the analog-to-digital converter (ADC) 3. The analog-to-digital converter (ADC) 3 of the PWM control loop is adapted to digitize the integrated error provided by the loop filter 2 every loop cycle of said PWM control loop to provide a digitized integrated error value applied to a digital input of the PWM controller 4 of the PWM control loop of the class D-amplifier. The PWM controller 4 has a PWM pulse generator 4C as shown in FIG. 2 adapted to generate, in a normal operation mode, PWM pulses supplied to the H-bridge driver 7 of the class D-amplifier in response to the digitized integrated error values. The H-Bridge driver 7 forms a circuit under feedback control since its operation is controlled by the PWM controller 4 being part of the feedback PWM control loop. In a startup sequence, the PWM pulse generator 4C of the PWM controller 4 is adapted to control the feedback digital-to-analog converter 5 according to the digitized integrated error values to supply PWM pulses as a first control signal PWM-CRTL1 to the loop filter 2 of the PWM control loop, and to control the H-bridge driver 7 as the system under feedback control to generate a fixed PWM pulse pattern as an independent control signal PWM-CRTL2 with a fixed pulse pattern.

Figure 3:
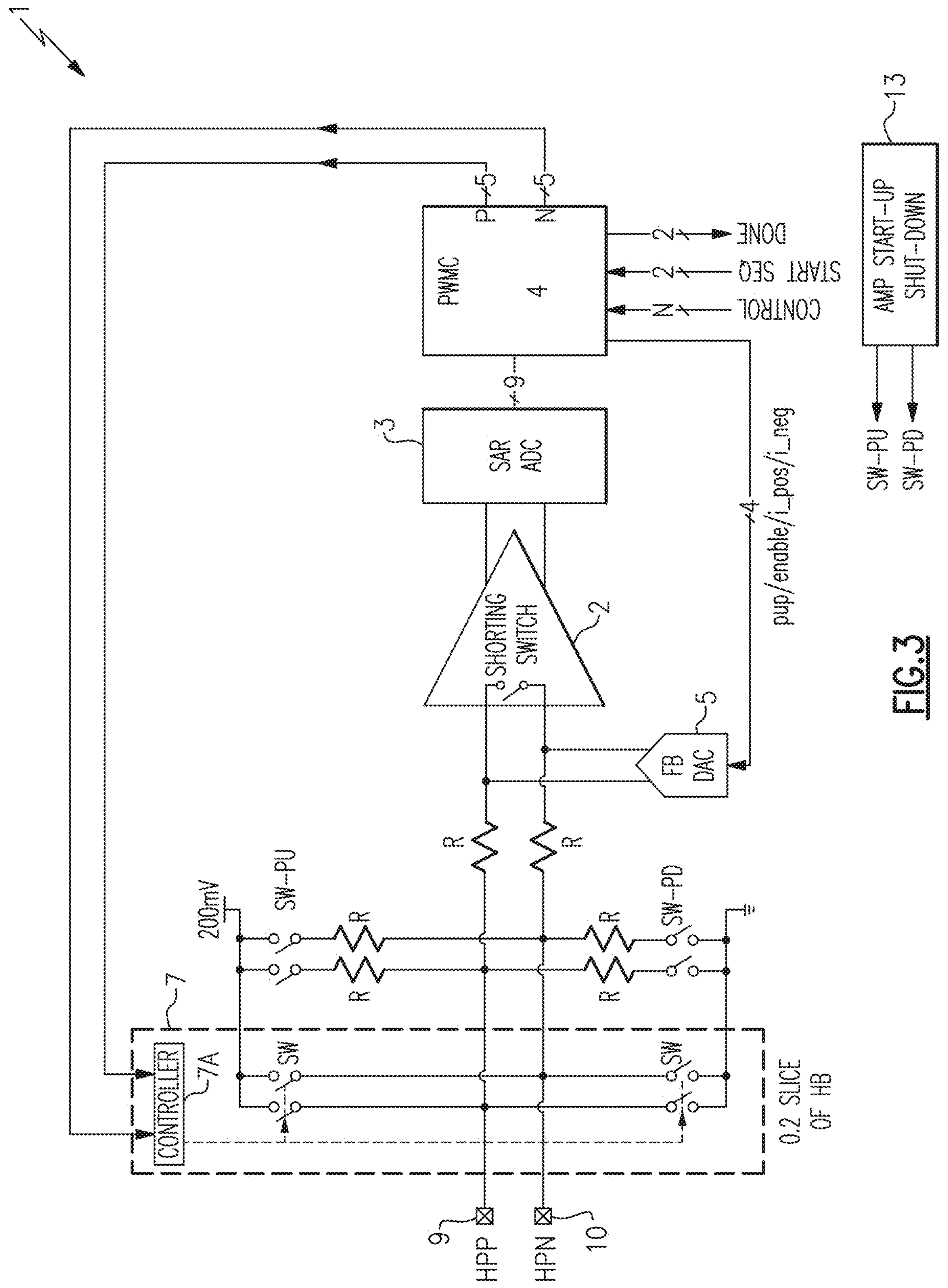
FIG. 3 is a block diagram of an embodiment of a transition smoothing apparatus.

The transition smoothing apparatus 1 as illustrated schematically in FIG. 1A comprises an alignment detector 8. In the embodiment illustrated in FIG. 1A, the alignment detector 8 is integrated in the PWM controller 4 of the PWM control loop. The alignment detector 8 of the transition smoothing apparatus 1 is adapted to detect a phase alignment between the fixed PWM pulse pattern forming the second control signal provided by the H-bridge driver 7 and the first control signal including the PWM pulses provided by the feedback digital-to-analog converter (FB-DAC) 5 of the PWM control loop. The alignment detector 8 is used to control a transition into a closed loop operation of the PWM control loop in the normal operation mode during the startup sequence with a reduced spurious input to the system under feedback control formed by the H-bridge driver 7. The transition smoothing apparatus 1 can in the embodiment shown in FIG. 1 reduce an acoustic startup noise. In the illustrated embodiment of FIG. 1A, a loudspeaker 6 or another inductive load is connected to a positive output terminal 9 and to a negative output terminal 10 of the H-bridge driver 7 of the class D-amplifier. The alignment detector 8 of the transition smoothing apparatus 1 forming in the embodiment of FIG. 1 a noise reduction apparatus is adapted to detect, during the startup sequence, a phase alignment between the second control signal having a fixed PWM pulse pattern provided by the H-bridge driver 7 and the first control signal having PWM pulses provided by the feedback digital-to-analog converter 5 to control, during the startup sequence, a transition from an idle operation mode to a normal operation mode with a reduced acoustic startup noise. In a possible embodiment, a control block 13 of the transition smoothing apparatus 1 as shown in FIG. 3 can be provided to generate at least one startup control signal applied to the PWM controller 4 to initiate a transition from the idle operation mode to the normal operation mode during the startup sequence.

Figure 1B:
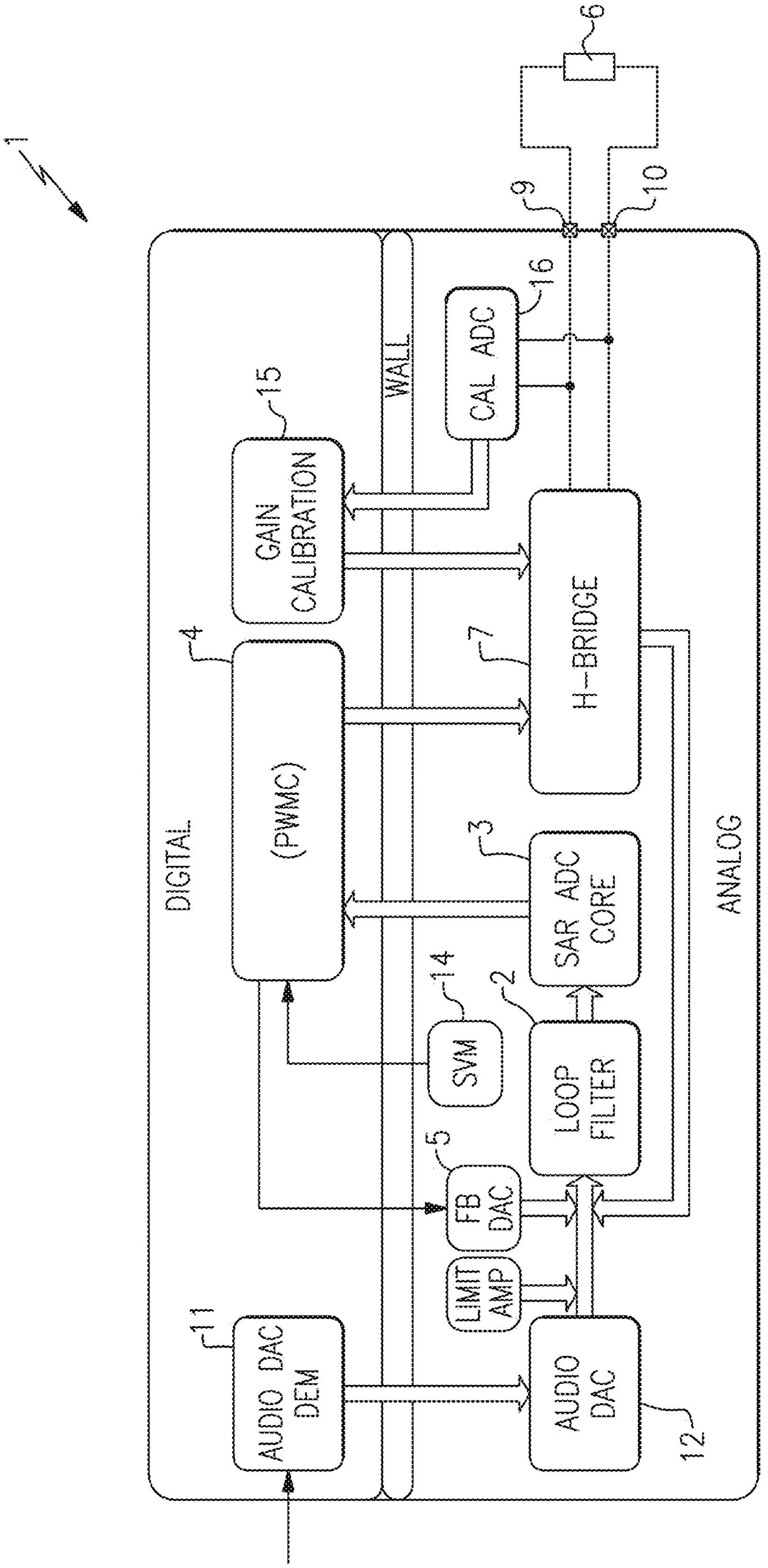

In a possible embodiment, the analog-to-digital converter (ADC) 3 within the PWM control loop of the class D-amplifier comprises a successive approximation register (SAR) analog-to-digital converter. Other types of analog-to-digital converters can be used as well. The successive approximation register (SAR) analog-to-digital converter 3 shown in FIG. 1B is adapted to convert a continuous analog waveform into a discrete digital representation using a binary search through all possible quantization levels before finally converging upon a digital output. During amplifier turnoff of the class D-amplifier, a minimum acoustic noise is produced. When the PWM control loop is started with the loudspeaker 6 connected to the class D-amplifier, the signal of the H-bridge driver 7 to initialize the PWM loop is also applied to the loudspeaker 6 and would, without the provision of the noise reduction apparatus 1 according to the present disclosure, generate an acoustic noise preventing a quiet startup. With the noise reduction apparatus 1 as illustrated in the block diagram of FIG. 1A, 1B, the acoustic startup noise and the startup sequence is minimized. The analog-to-digital converter 3 is adapted to supply a digital value to a digital input of the PWM controller 4 every sample period. Making use of the digitized loop value, the speaker driver of the loudspeaker 6 can be driven by low noise open loop high-frequency pulses when at the same time the digital-to-analog converter 5 uses the ADC value to drive the loop input and quiesce the loop level. Once the loop and the fixed pulse pattern are matched, the transition smoothing apparatus 1 implemented as a noise reduction apparatus can perform a transition to a closed loop operation using the SAR analog-to-digital converter 3 to find a point of best match. This close matching minimizes acoustic noise production during startup. Using the signal from the SAR analog-to-digital converter 3 of the PWM control loop, the best match between open and closed loop can be determined. By initializing the loop filter 2 without that signal being output to the loudspeaker 6, the startup noise as spurious input can be reduced. Digital values supplied by the SAR analog-to-digital converter 3 to the digital input of the PWM controller 4 can comprise in a possible embodiment an ADC code with an offset binary format.

The H-bridge driver 7 can comprise in a possible embodiment a positive H-bridge driver circuit connected to the positive output terminal 9 and a negative H-bridge driver circuit connected to the negative output terminal 10. The PWM pulse generator 4C integrated in the PWM controller 4 can be adapted in a possible embodiment to supply a first gray-coded output value to the positive H-bridge driver circuit of the H-bridge driver 7 and a second gray-coded output value to the negative H-bridge driver circuit of the H-bridge driver 7.

FIG. 1B shows a further block diagram for illustrating a possible exemplary embodiment of a transition smoothing apparatus 1 according to the present disclosure. In the circuit as illustrated in the embodiment of FIG. 1B, an error between a desired audio level as set by the input audio stream and the actual input voltage across the loudspeaker 6 is integrated by the loop filter 2 of the PWM control loop. This integrated error is digitized by a SAR analog-to-digital converter 3 and is supplied to the digital input of the PWM controller 4 in order to generate a different pulse on one of a set of possible supply voltages. The PWM controller 4 is provided for optimally generating the necessary pulse given the received analog-to-digital converter 3 sampled value and available supply voltages. The PWM controller 4 can comprise in a possible embodiment a supply voltage monitoring (SVM) and prediction circuit 4A as shown in FIG. 2 adapted to maintain a target voltage. The PWM controller 4 can also comprise a common mode control circuit adapted to maintain a set-point common mode voltage. The PWM controller 4 is provided to maintain a desired output current mode voltage as calculated and supplied by the common mode control circuit. The PWM controller 4 can generate a PWM pulse in response to a received ADC code that is provided by the analog-to-digital converter 3 every loop cycle of the PWM control loop. In a possible embodiment, a different pulse is created on both positive and negative edges to allow in a possible implementation 32 possible widths. One of several supply voltages can be selected to maintain a target voltage, while optimizing for power efficiency.

In the illustrated embodiment of FIG. 1B, a digital audio signal can be supplied to an audio DAC DEM (Dynamic Element Matching) block 11 on a digital side of the circuit. The digital side of the circuit is separated by a wall of level shifters from an analog side of the circuit having an audio DAC 12. The output of the audio DAC 12 is connected to the input of the analog loop filter 2 of the PWM control loop as illustrated in FIG. 1B. In the illustrated embodiment of FIG. 1B, the supply voltage monitor (SVM) unit 14 is also connected to the PWM controller 4. Further, the circuit illustrated in FIG. 1B comprises a gain calibration block 15 connected to an analog-to-digital converter 16 at the output of the H-bridge driver 7.

FIG. 2 shows a functional block diagram of a PWM controller 4 of the transition smoothing apparatus 1. In the illustrated embodiment, the PWM controller 4 comprises an integrated alignment detector 8. In an alternative embodiment, the alignment detector 8 can also form a separate unit within the noise reduction apparatus 1. The PWM controller 4 comprises in the illustrated embodiment of FIG. 2 a supply voltage monitoring and prediction circuit 4A receiving signals from the supply voltage monitoring (SVM) unit 14. In the illustrated embodiment of FIG. 2, the PWM controller 4 further comprises a cycle counter 4B (modulo-32). The cycle counter 4B receives in the illustrated implementation clock signals which are multiples of the loop frequency. In the illustrated implementation, the cycle counter 4B receives a 48 MHz clock signal and a 3 MHz clock signal from corresponding clock signal source. Further, the cycle counter 4B can receive an active low reset signal RST_N.

The PWM controller 4 further comprises a pulse generator and an output common mode controller 4C as shown in FIG. 2. The PWM controller 4 can further comprise a loop phase compensation circuit 4D receiving FIR coefficients. The output of the loop phase compensation circuit 4D is connected to the pulse generator and output common mode controller 4C of the PWM controller 4. The PWM pulse generator and output common mode controller 4C generates in the illustrated implementation gray-coded output values supplied to the H-bridge driver 7. In the illustrated embodiment, the pulse generator and output common mode controller 4C generates a 5-bit gray-coded output value for the positive H-bridge driver circuit and a 5-bit gray-coded output value for the negative H-bridge driver circuit. The loop phase compensation circuit 4D receives in the shown embodiment a 9-bit SAR ADC code from the SAR analog-to-digital converter 3 of the PWM control loop. This SAR ADC code can be updated in a possible embodiment every 3 MHz sample period. The format of the SAR ADC code can be offset binary. The bits can arrive MSB first with a delay of less than 6 ns between the bits. Further, the PWM controller 4 can receive an amplification mode control signal AMP MODE as illustrated in FIG. 2.

FIG. 3 shows a further block diagram for illustrating a further embodiment of a noise reduction apparatus 1. A conventional class D-amplifier may produce an unwanted acoustic noise as spurious input to the H-bridge driver 7 during startup and shutdown. The transition smoothing apparatus 1 according to the present invention is provided for reducing such acoustic noise.

The functionality of a startup procedure is to bring the PWM class D-amplifier into a stable closed loop operation being ready to accept audio without pop-n-click artifacts. Pop-n-click artifacts include popping acoustic noise that may be heard through the loudspeaker 6 when the audio equipment including the class D-amplifier 2 is switched on. Acoustic noise may be generated by a voltage difference across the output stage of the class D-amplifier at switch-on or at switch-off before it reaches its idle or equilibrium state. Undesirable audio click and pop noise is generated in a speaker or headphone connected to the H-bridge driver output of the class D-amplifier. Compared to conventional linear amplifiers, conventional class D-amplifiers are more prone to produce click and pop noise. The transition smoothing apparatus 1 according to the present invention is adapted to minimize such unwanted acoustic noise and to meet the requirements of pop-n-click specifications. With the transition smoothing apparatus 1 according to the present invention, the unwanted acoustic noise can be reduced to such an extent that it is no longer audible to persons listening to the loudspeaker 6.

The functionality of a shutdown procedure is likewise to turn off the PWM class D-amplifier without any hearable pop-n-click artifacts. As can be seen in FIG. 3, the loudspeaker 6 of FIGS. 1A and 1B can be integrated for instance in a headphone or other audio equipment that is connected to the positive output terminal 9 of the positive H-bridge driver circuit of the H-bridge driver 7 and to the negative output terminal 10 of the negative H-bridge driver circuit of the H-bridge driver 7. As illustrated schematically in FIG. 3, the H-bridge driver 7 comprises controllable switches SW which can be formed by power MOSFETs. The switches SW of the H-bridge driver 7 can be controlled in a possible implementation by a timing controller 7A of the H-bridge driver 7. The timing controller 7A of the H-bridge driver 7 receives in the illustrated embodiment gray-coded output values generated by the PWM controller 4. The output terminals 9, 10 are connected internally via resistors R to the analog loop filter 2 of the PWM control loop as shown in FIG. 3. The output of the loop filter 2 is connected in the illustrated embodiment to the SAR analog-to-digital converter 3 of the PWM control loop which is adapted to digitize the integrated error every loop cycle of the PWM control loop to provide a digitized integrated error value to the digital input of the PWM controller 4. The PWM controller 4 comprises the integrated PWM pulse generator and output common mode controller circuit 4C as shown in FIG. 2 to generate in a normal operation mode and in response to the digitized integrated error values PWM pulses supplied to the H-bridge driver 7 of the class D-amplifier. The PWM pulse generator and output common mode controller 4C is further adapted to control the feedback digital-to-analog converter 5 in a startup sequence according to the digitized integrated values to supply PWM pulses as a first control signal to the loop filter 2 of the PWM control loop and to control the H-bridge driver 7 to generate a fixed PWM pulse pattern used as a second control signal for alignment. The alignment detector 8 which can be integrated in the PWM controller 4 can detect a phase alignment between the second control signal comprising the fixed PWM pulse pattern provided by the H-bridge driver 7 and the first control signal comprising PWM pulses provided by the feedback digital-to-analog converter 5 to control a seamless and smooth transition from a startup sequence with a reduced acoustic startup noise to a closed loop operation of the PWM control loop in the normal operation mode.

In the illustrated embodiment of FIG. 3, the transition smoothing apparatus 1 comprises a control block 13 which can be used to control a startup and/or a shutdown sequence of the class D-amplifier. The control block 13 is adapted to generate startup control signals applied to the PWM controller 4 to initiate during the startup sequence a transition from an idle operation mode to the normal operation mode of the class D-amplifier. The alignment detector 8 of the PWM controller 4 is adapted to detect a phase alignment between the second control signal comprising a fixed PWM pulse pattern provided by the H-bridge driver 7 during the startup sequence and the first control signal comprising PWM pulses provided by the feedback digital-to-analog converter 5 during the startup sequence. The detected phase alignment is used to control during the startup sequence of the class D-amplifier the transition from the idle operation mode to the normal operation mode with a reduced startup acoustic noise.

During the PWM startup sequence, the H-bridge driver 7 and the feedback digital-to-analog converter 5 are enabled by the control block 13. As can be seen in the circuit diagram of FIG. 3, the PWM controller 4 does supply in the illustrated embodiment four output control signals to the feedback digital-to-analog converter 5. These control signals include an fbdac_pup_out control signal output by an FB DAC power-up pin of the PWM controller 4. Further, there is an fbdac_en_out control signal output by an FB DAC enable pin of the PWM controller 4. A third control signal supplied by the PWM controller 4 to the feedback digital-to-analog converter 5 comprises an fbdac_i_pos_o output by an FB DAC positive pulse pin of the PWM controller 4. The fourth control signal supplied by the PWM controller 4 to the FB DAC 5 comprises an fbdac_i_neg_o output by an FB DAC negative pulse pin of the PWM controller 4.

The PWM controller 4 is connected via a control interface to the control block 13 provided for performing the control of the startup and shutdown sequence. The PWM controller 4 receives from the control block 13 a first control signal pwmc_on_start_i which indicates to the PWM controller 4 to start searching for alignment of the H-bridge PWM pulse to the SAR value provided by the SAR ADC 3. Further, the PWM controller 4 can receive a pwmc_off_start_i control signal from the control block 13 which indicates the start of a shutdown fixed pattern.

The PWM controller 4 further receives digital control signals from the control block 13 including an hb_drv_output_en_i signal, an hb_drv_200mv_i control signal and an fdbk_dac_en_i control signal. The hb_drv_output_en_i control signal received from the control block 13 indicates to the PWM controller 4 that the H-bridge driver 7 should be enabled. The hb_drv_200mv_i control signal received by the PWM controller 4 from the control block 13 indicates to the PWM controller 4 to start the H-bridge fixed pulse pattern. Further, the fdbk_dac_en_i control signal received by the PWM controller 4 from the control block 13 indicates a start of the FB DAC pattern.

The PWM controller 4 provides a feedback to the control block 13 by means of two output control signals including a pwmc_done_1_o control signal and a pwmc_donE_2_o control signal. The first feedback control signal pwmc_done__1_o indicates to the control block 13 during startup that the startup has been completed. The pwmc_done_1_o control signal signals to the control block 13 during shutdown that the shutdown fixed pattern has been completed. The second feedback control signal pwmc_done_2_o output by the PWM controller 4 to the control block 13 indicates during shutdown that the shutdown final pulse has been completed.

The startup/shutdown control block 13 can also be provided to disable the passive pullups (PU) on the positive output terminal 9 and the passive pulldowns (PD) on the negative output terminal 10 of the class D-amplifier by controlling the switches SW-PU, SW-PD as illustrated in FIG. 3 supplied by a common mode voltage of e.g., 200 mV.

Figure 4:
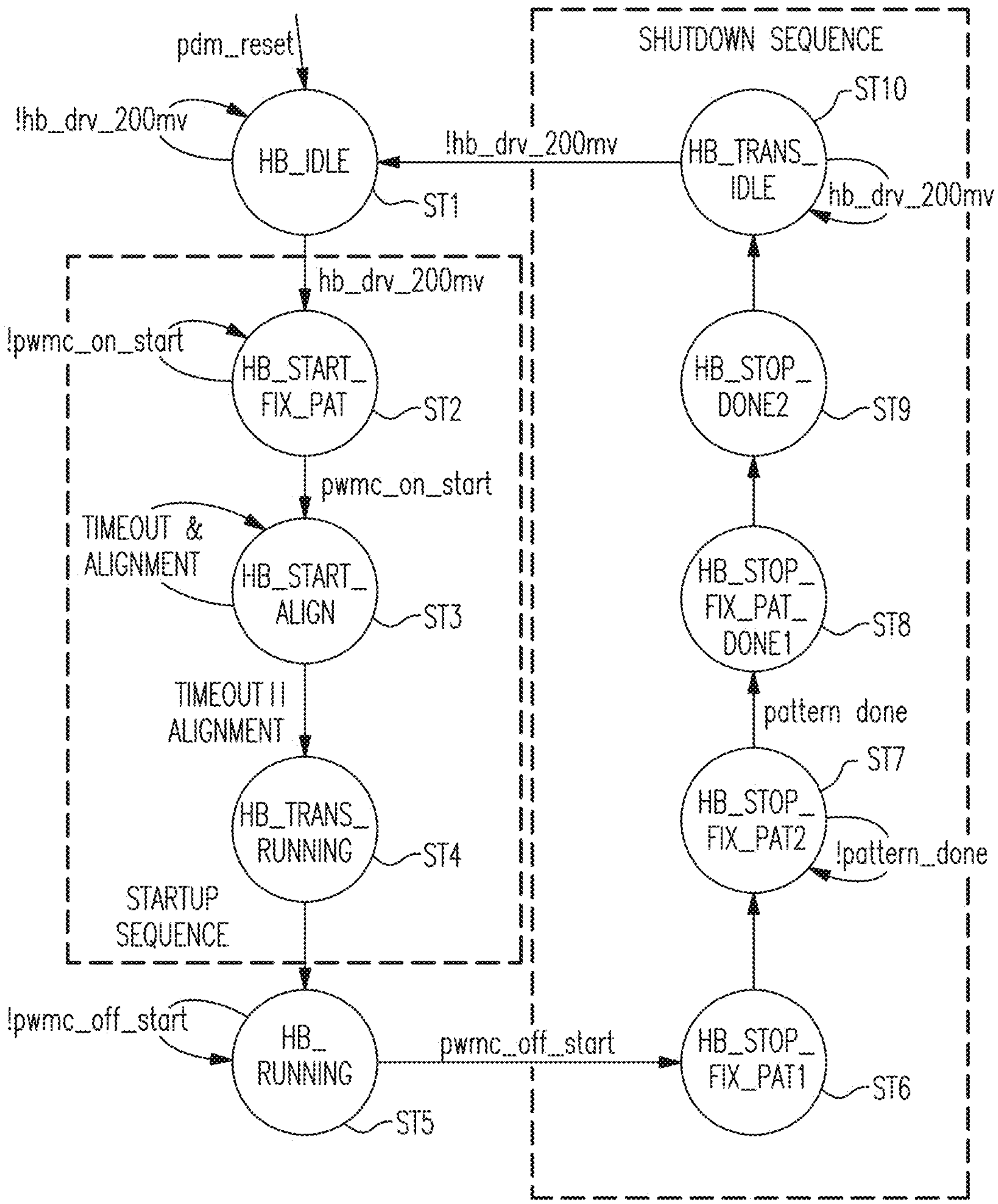
FIG. 4 is a state diagram illustrating different states of a transition smoothing apparatus during a startup and shutdown sequence.

FIG. 4 shows a state diagram for the startup and shutdown sequence of the class D-amplifier. The state diagram comprises in the illustrated implementation ten different states ST1 to ST10. Transitions between the different states are performed in response to control signals.

A first state ST1 comprises a HB idle state where the PWM controller 4 is not running. In response to the startup control signal hb_drv_200 mv received by the PWM controller 4 from the control block 13, a transition is performed to the second state ST2 (HB_START_FIX_PAT) where a fixed pattern of minimum pulses is generated in an open loop. In response to the pwmc_on_start control signal received by the PWM controller 4 from the control block 13, a transition to the third state ST3 (HB_START_ALIGN) is performed. In this third state ST3, it is waited for the alignment of the PWMC positive pulse and the SAR ADC output. If a predefined time has elapsed or an alignment has been detected by the alignment detector 8, a transition from the third state ST3 to the fourth state ST4 (HB_TRANS_RUNNING) is performed. In the HB running state ST4, a transition to the closed loop is performed and the signal pwmc_done_1 can be output to indicate that the startup sequence has been completed. The pwmc_done_1 output signal signals the end of the startup sequence and there is a transition to the fifth state ST5 (HB_RUNNING) where the PWM controller 4 is running in a closed loop.

After having received a pwmc_off_start signal from the control block 13, a shutdown sequence is initiated and a transition to the sixth state ST6 (HB_STOP_FIX_PAT1) is performed. In this sixth state ST6, a fixed pattern of min pulses is run in an open loop. In the next state ST7 (HB_STOP_FIX_PAT2), also a fixed pattern of min pulses is run in an open loop. After having received a pattern done control signal by using an internal counter, a transition to the next state ST8 (HB_STOP_FIX_PAT_DONE1) is done. In the next state ST9 (HB_STOP_DONE2), a pwmc_done_2 control signal is supplied by the PWM controller 4 to the control block 13 to indicate that the shutdown final pulse has been completed. Finally, there is a transition during the shutdown sequence into the tenth state ST10 (HB_TRANS_IDLE) where a static common mode value is driven until receiving a disable signal (ihb_drv_200 mv).

Figure 5:
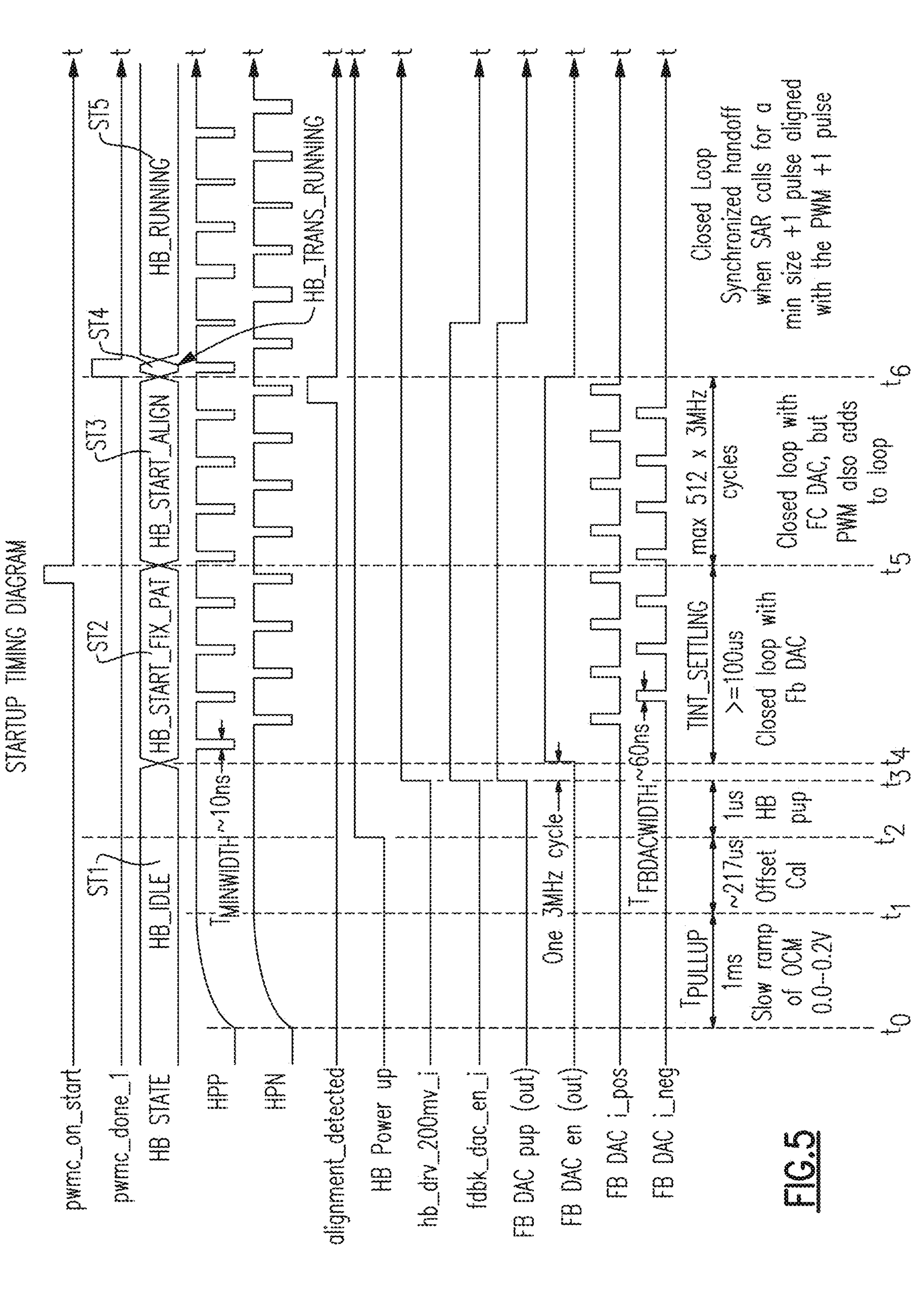
FIG. 5 is a startup timing diagram illustrating signals during a startup sequence of a transition smoothing apparatus.

FIG. 5 shows the timing of the control signals during the startup sequence, i.e., for the states ST1 to ST5 illustrated in the state diagram of FIG. 4. Initially, a class D-amplifier is in the first state ST1, i.e., HB_IDLE, as illustrated in FIG. 5. At time $t_0$, a slow ramp-up of the Offset Calibration Mode (OCM) from 0 to 200 mV is performed until time $t_1$ during a ramp-up time period $T_{pullup}$ lasting for instance 1 ms. This pullup can be controlled by the control block 13 by controlling the pullup switches PU-SW and the pulldown switches PD-SW illustrated in the block diagram of FIG. 3. Subsequently, an offset calibration can be performed between time $t_1$ and time $t_2$ as shown in FIG. 5. At time $t_2$, a HB_Power_Up control signal is received to perform the power-up of the H-bridge driver 7. The power-up of the H-bridge driver 7 can last for instance 1 ms as illustrated in the timing diagram of FIG. 5. At time $t_3$, the PWM controller 4 receives the hb_drv_200 mv control signal and the fdbk_dac_en_i control signal from the control block 13. This indicates the start of the H-bridge fixed pattern generation. At time $t_4$, the FB DAC power-up signal is applied to the feedback digital-to-analog converter 5 as shown in FIG. 5. On reception of the hb_drv_200 mv control signal, a transition from the first state ST1 to the second state ST2 (HB_START_FIX_PAT) is performed where a fixed PWM pulse pattern is generated by the H-bridge driver 7 at the positive output terminal (HPP) 9 and at the negative output terminal (HPN) 10 as illustrated in FIG. 5. In the illustrated implementation, the pulses of the fixed pattern provide a pulse width of approximately 10 ns. In the illustrated embodiment, the pattern comprises a differential signal with low-going pulses. In response to the pwmc_on_start signal shown in the first line of the timing diagrams in FIG. 5, a transition from the second state ST2 to the third state ST3 (HB_START_ALIGN) is performed. In this third state ST3, it is waited for an alignment of the PWMC pulses and the SAR output from the SAR ADC 3. This alignment can be detected by the alignment detector 8 integrated in the PWM controller 4. In the example shown in FIG. 5, the alignment is detected by the alignment detector 8 at time to to trigger a transition from the third state ST3 to the fourth state ST4 (HB_TRANS_RUNNING). As soon as the pwmc_done_1 control signal has been generated by the PWM controller 4 and notified to the control block 13, a transition from the fourth state ST4 to the fifth state ST5 (HB_RUNNING) is performed where the class D-amplifier operates in a normal operation in a closed loop. In the illustrated implementation, the alignment procedure in the third state ST3 can last maximum 512×3 MHz cycles.

When the PWM encoder output is aligned with the loop, the feedback digital-to-analog converter 5 is disabled and the PWM encoder is enabled to control the HB driver 7 in a closed loop mode. The PWM controller 4 guarantees that the transition of the closed loop operation of the PWM control loop is seamless at the loop filter input of the loop filter 2.

In a possible implementation, at each sample time, the SAR ADC output of the SAR analog-to-digital converter 3 is examined. If it indicates that the next PWM pulse required would be a class 1 (a 0.5×48 MHz cycle positive pulse, 0.2 V rail), the feedback digital-to-analog converter 5 is immediately disabled and does release the PWM to run in a closed loop mode. This is performed for a maximum of 128 sample times.

If an alignment has not yet been found, in a possible embodiment, the search is expanded to look for a case where the next pulse required is either +1 or +2. This can be done for a maximum of 128 sample times.

If an alignment has still yet not been found, the search can be expanded for a case where the next pulse required is either 0, +1, or +2, for a maximum of 128 sample times. If an alignment has still not been found, the search can be further expanded to 0, +1, +2, +3, for a maximum of 128 sample times. If an alignment has not been found after 4×128=512 samples, it can be assumed that a match is not likely to be ever found and the feedback digital-to-analog converter 5 is automatically disabled and the PWM control loop is released to run in a closed loop mode. This may result in an unwanted pop event. The pwmc_done_1 control signal is asserted for one 3 MHz clock cycle to signal to the control block 13 that the startup sequence is complete.

As can be seen in FIG. 5, after one 3 MHz clock cycle, the PWM controller 4 starts driving the feedback digital-to-analog converter (DAC) 5 either to +1, 0, or −1 in the second state ST2 and the third state ST3, i.e., between time $t_4$ and time $t_6$. These pulses comprise all the same duration $T_{FBDACWIDTH}$. The duration can be programmable and may be for instance comprise 60 ns as illustrated in FIG. 5. This places the pulses away from the 3 MHz clock edge. A choice of what to drive can be determined by the polarity of the output of the SAR analog-to-digital converter 3. The second state ST2 can last long enough to let the PWM control loop settle and may last at least time $T_{INT\_SETTLING}$ of e.g., 100 μs as illustrated in FIG. 5. The timing can be controlled by the control block 13 which generates the pwmc_on_start control signal to trigger a transition to the third state ST3 (HB_START_ALIGN) as shown in FIG. 5. When the feedback digital-to-analog converter 5 has been enabled and is running in a closed loop after time $t_4$, the PWM controller 4 will start and repeat a pulse pattern of switching from 200 mV to 0 V with minimum width pulses having the pulse width $T_{MINWIDTH}$ of e.g., 3 ns alternating on HPP and HPN, as shown in FIG. 5. The illustrated pulses comprise low-going pulses since HPP and HPN are idling at 0.2 V. HPP/HPN output is switching with zero differential output voltage and slightly below the 200 mV common mode voltage. The alignment performed as illustrated in the timing diagrams of FIG. 5 allows a seamless smooth transition into the closed loop operation of the PWM control loop in the normal operation mode such that only a minimal not hearable acoustic startup noise is generated. In this way, unwanted acoustic artifacts at the loudspeaker 6 are avoided.

Figure 6:
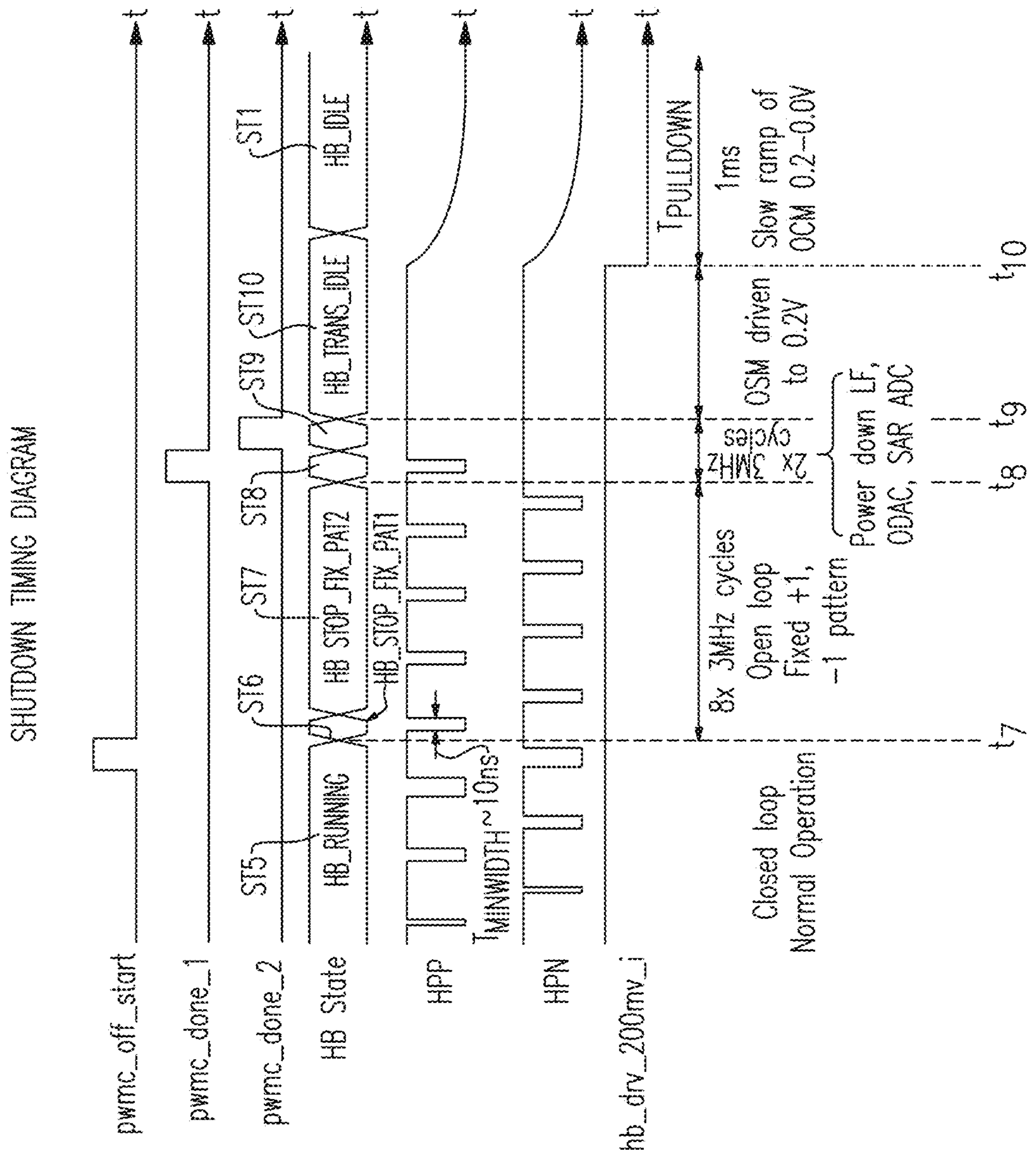
FIG. 6 is a shutdown timing diagram illustrating signals during a shutdown sequence of a transition smoothing apparatus.

FIG. 6 illustrates control signals during a shutdown sequence of the class D-amplifier 2. Until time $t_7$, the class D-amplifier operates in the normal operation mode in a closed loop and comprises the fifth state ST5 as illustrated in the state diagram of FIG. 4. As soon as the pwmc_off_start control signal is received from the control block 13, a transition to the sixth state ST6 (HB_STOP_FIX_PAT1) is performed running a fixed pattern of minimum pulses in an open loop. A transition to open loop PWM pulses with first pulse matching the polarity of the SAR ADC decision and the fixed pulse width $T_{MINWIDTH}$, e.g., 10 ns, is performed. The PWM pulses still alternate on HPP and HPN as shown in FIG. 6. Both HPP and HPN are idling at 200 mV and the fixed pulses are low-going pulses with a width $T_{MINWIDTH}$ of e.g., 10 ns as shown in FIG. 6. After a predefined number of sample periods, a first PWM done control signal is supplied by the PWM controller 4 to the control block 13 as shown in FIG. 6 so it can proceed to power down the loop filter 2, the feedback digital-to-analog converter 5 and the SAR analog-to-digital converter 3. In the example shown in FIG. 6, the predefined number of sample periods comprises eight sample periods of 3 MHz cycles. A transition from state ST7 to state ST8 is performed in response to a pattern done control signal after an internal counter has counted to 8. A transition from the eighth state ST8 (HB_STOP_FIX_PAT_DONE1) to the ninth state ST9 (HB_STOP_DONE2) is performed at time $t_0$. The H-bridge switching is stopped with the last pulse at minimum width $T_{MINWIDTH}$. Both HB driver circuits of the H-bridge driver 7 can still be enabled and driving the output to 200 mV output as shown in FIG. 6. A second pwmc_done control signal is supplied at time $t_0$ to the control block 13 so it can proceed with its other tasks. A transition from the ninth state ST9 (HB_STOP_DONE2) to the tenth state ST10 (HB_TRANS_IDLE) driving a static common mode value is done at time $t_0$. After having received a disable signal at time $t_{10}$, a transition to the initial state ST1 (HB_IDLE) where the PWM controller 4 is not running is performed as shown in FIG. 6. This results in a slow ramp of OCM during $T_{PULLDOWN}$ of e.g., 1 ms as shown in FIG. 6.

According to a further aspect of the present disclosure, a method for reducing spurious input to a system under feedback control 7 connected to a control loop is provided. The method comprises the steps of: integrating in a first step, by a loop filter 2 of the control loop, an error between an input signal applied to the loop filter 2 and an output signal of the system under feedback control 7; digitizing in a second step, by an analog-to-digital converter 3 of the control loop the integrated error every loop cycle of the control loop to provide a digitized integrated error value; generating in a third step, by a controller 4 of the control loop in a normal operation mode in response to the digitized integrated error values output values supplied to the system under feedback control 7, the controller 4 controlling in a start-up sequence a feedback digital-to-analog converter 5 of the control loop according to the digitized integrated error values to supply a first control signal to the loop filter 2 of the control loop and controlling the system under feedback control 7 to generate an independent second control signal; and detecting in a fourth step, by an alignment detector 8, a phase alignment between the first control signal provided by the feedback digital-to-analog converter 5 of the control loop and the second control signal provided by the system under feedback control to control a smooth transition into a closed loop operation of the control loop in the normal operation mode during the start-up sequence with reduced spurious input to the system under feedback control 7.

Figure 7:
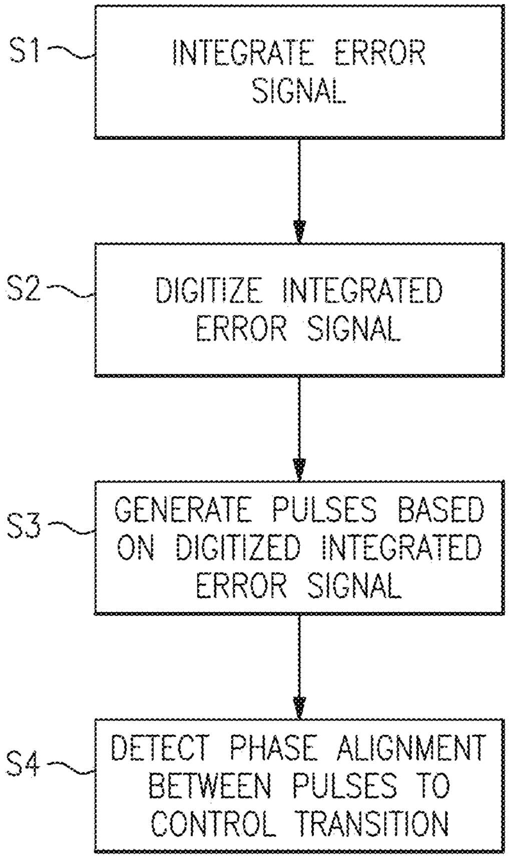
FIG. 7 is a flow chart for illustrating an embodiment of a method for reducing spurious input into a system under feedback control, such as an acoustic start-up noise of a class D-amplifier including a PWM control loop.

FIG. 7 shows a flow chart for illustrating a specific embodiment of the method for reducing spurious input formed by a noise reduction method for reducing an acoustic start-up noise of a class D-amplifier including a PWM control loop. The method shown in FIG. 7 comprises, inter alia, several steps S1 to S4.

A first step (S1) comprises integrating by a loop filter 2 of a PWM control loop an error between an input voltage which corresponds to an input audio signal and a voltage across a loudspeaker 6 connected to a H-bridge driver 7 of a class D-amplifier.

A second step (S2) comprises digitizing by an analog-to-digital converter 3 of the PWM control loop the integrated error every loop cycle of said PWM control loop to provide a digitized integrated error value.

A third step (S3) comprises generating, by a PWM pulse generator 4C of a PWM controller 4 of said PWM control loop in a normal operation mode in response to the digitized integrated error values, PWM pulses supplied to the H-bridge driver 7 of said class D-amplifier and controlling by the PWM controller 4 in a start-up sequence a feedback digital-to-analog converter 5 of the PWM control loop according to the digitized integrated error values to supply PWM pulses as a first control signal to the loop filter 2 of the PWM control loop and controlling by the PWM controller 4 the H-bridge driver 7 of the class D-amplifier to generate a fixed PWM pulse pattern as a second control signal.

A fourth step (S4) comprises detecting by an alignment detector 8 a phase alignment between the second control signal comprising a fixed PWM pulse pattern provided by the H-bridge driver 7 and the first control signal comprising PWM pulses provided by the feedback digital-to-analog converter 5 to control a transition into a closed loop operation of the PWM control loop in the normal operation mode during the start-up sequence with a reduced acoustic start-up noise.

Some of the embodiments described above have provided examples in connection with a class D-amplifier. However, the principles and advantages of the embodiments can be used for any other audio equipment or other audio processing devices that have needs for power amplifiers.

The transition smoothing apparatus 1 can be used to reduce spurious input to a variety of systems or circuits under feedback control 7, i.e., an electronic circuit having a feedback loop. The feedback loop of the circuit under feedback control 7 can be implemented by an analog feedback loop or by a digital feedback loop. An example for a circuit under feedback control 7 is a Phase Locked Loop (PLL) circuit. The PLL can comprise a feedback loop including a phase comparator, a filter and a voltage controlled oscillator (VCO). The PLL can be e.g., for clock synchronization, demodulation or frequency synthesis in an electronic device. The feedback loop can also include a sigma-delta modulator. The transition smoothing apparatus 1 can be used for a huge range of electronic devices.

Examples of the electronic devices can include, but are not limited to, consumer electronic products, audio devices, parts of the consumer electronic products, electronic test equipment, etc. Examples of the electronic devices can also include, but are not limited to, memory chips, memory modules, or other communication networks, and disk driver circuits. The consumer electronic products or audio devices can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A circuit configured to reduce input noise in a system having feedback control, the circuit comprising:

a digital-to-analog converter (DAC) configured to generate a first control signal, the first control signal being an analog signal;

a driver configured to operate in a closed-loop mode and an open-loop mode, the driver further configured to generate a second control signal in the open-loop mode, the second control signal being an analog signal;

an alignment detector configured to receive the first control signal and the second control signal, the alignment detector further configured to determine a phase difference between the first control signal and the second control signal; and a controller configured to receive the phase difference and, responsive to determining that the phase difference is zero or near zero, the controller is configured to switch the driver from the open-loop mode to the closed-loop mode of operation.

2. The circuit of claim 1 further comprising a loop filter and a serial approximation register analog-to-digital converter (SAR ADC), an input of the loop filter being coupled to an output of the DAC, the input of the loop filter being configured to receive the first control signal, and the SAR ADC being configured to convert an output of the loop filter into a digital output signal and provide the digital output signal to the controller.

3. The circuit of claim 2 wherein the input of the loop filter is a differential input having a first input connection and a second input connection, wherein the first input connection is coupled to a first resistor and the second input connection is coupled to a second resistor.

4. The circuit of claim 3 wherein the driver includes a positive output and a negative output, the positive output being coupled to the first resistor and the negative output being coupled to the second resistor.

5. The circuit of claim 4 wherein the driver includes a first driver circuit coupled to the positive output and configured to drive the positive output, and a second driver circuit coupled to the negative output and configured to drive the negative output.

6. The circuit of claim 1 further comprising a speaker coupled to the driver.

7. The circuit of claim 6 wherein the speaker is configured to not receive the second control signal in the open-loop mode.

8. The circuit of claim 1 wherein the controller is configured to transition the driver from the open-loop mode to the closed-loop mode responsive to the second control signal and first control signal aligning in phase.

9. A transition smoothing apparatus for reducing spurious input to a system, the apparatus comprising:

a digital-to-analog converter (DAC) configured to generate a first control signal;

a driver configured to operate in a plurality of modes of operation, the driver further configured to generate a second control signal;

a controller communicatively coupled to the DAC and the driver, and configured to control the DAC to generate the first control signal, control the driver to generate the second control signal such that the second control signal has a fixed pattern, receive the first control signal and the second control signal, determine a phase difference between the first control signal and the second control signal, and responsive to determining that the phase difference is zero, control the driver to transition from an open-loop mode of operation to a closed-loop mode of operation.

10. The apparatus of claim 9 further comprising an analog-to-digital converter (ADC) configured to receive the first control signal and convert the first control signal to digital form.

11. The apparatus of claim 10 wherein the ADC is a serial approximation register (SAR) ADC.

12. The apparatus of claim 10 further comprising a loop filter couped to the DAC and to the ADC, the loop filter being configured to receive the first control signal from the DAC and to provide an output signal based on the first control signal to the ADC, wherein the ADC provides the output signal to the controller.

13. The apparatus of claim 12 further comprising a loop filter configured to integrate an error between an input signal applied to the loop filter and an output signal of the driver.

14. The apparatus of claim 12 wherein the loop filter is an analog low pass filter.

15. The apparatus of claim 12 wherein the controller is further configured to treat the output signal from the ADC as the first control signal.

16. The apparatus of claim 9 wherein the apparatus includes an alignment detector coupled to the controller, the alignment detector being configured to determine the phase difference and provide the phase difference to the controller.

17. The apparatus of claim 9 wherein the controller is configured to perform, during a start-up mode of operation corresponding to an initial activation of the apparatus, one or more of the operations of controlling the DAC to generate the first control signal, controlling the driver to generate the second control signal such that the second control signal has a fixed pattern, receiving the first control signal and the second control signal, determining the phase difference between the first control signal and the second control signal, and controlling the driver to transition from the open-loop mode of operation to the closed-loop mode of operation.

18. The apparatus of claim 17 wherein the controller is configured to determine the phase difference every clock cycle during the start-up mode of operation.

19. The apparatus of claim 17 wherein the controller is further configured to cease determining the phase difference during an audio-output mode of operation, the audio-output mode of operation corresponding to the closed-loop mode of operation of the driver.

20. The apparatus of claim 9 wherein the driver includes a positive driver and a negative driver.

* * * * *